(12) United States Patent
Lin et al.

(10) Patent No.: US 10,043,901 B2
(45) Date of Patent: Aug. 7, 2018

(54) ULTRA-HIGH VOLTAGE DEVICES

(71) Applicant: Vanguard International Semiconductor Corporation, Hsinchu (TW)

(72) Inventors: Wen-Hsin Lin, Jhubei (TW); Yu-Hao Ho, Keelung (TW); Shin-Cheng Lin, Tainan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 66 days.

(21) Appl. No.: 15/285,213

(22) Filed: Oct. 4, 2016

(65) Prior Publication Data

US 2018/0097108 A1    Apr. 5, 2018

(51) Int. Cl.
| | |
|---|---|
| *H01L 29/76* | (2006.01) |
| *H01L 29/78* | (2006.01) |
| *H01L 29/06* | (2006.01) |
| *H01L 29/423* | (2006.01) |

(52) U.S. Cl.
CPC ...... *H01L 29/7835* (2013.01); *H01L 29/0649* (2013.01); *H01L 29/0684* (2013.01); *H01L 29/42364* (2013.01); *H01L 29/7816* (2013.01)

(58) Field of Classification Search
CPC ............ H01L 29/7835; H01L 29/0649; H01L 29/0684; H01L 29/7816; H01L 29/42364; H01L 29/66659; H01L 29/7801; H01L 29/7833; H01L 29/66681; H01L 29/66674
USPC ................................................. 257/335, 343
See application file for complete search history.

(56) References Cited

U.S. PATENT DOCUMENTS

| | | | |
|---|---|---|---|
| 6,753,580 B1 * | 6/2004 | Francis | ............ H01L 29/66136 |
| | | | 257/367 |
| 7,126,841 B2 | 10/2006 | Rinerson et al. | |
| 7,633,788 B2 | 12/2009 | Choi et al. | |
| 8,649,203 B2 | 2/2014 | Chung | |
| 8,861,259 B2 | 10/2014 | Haukness | |
| 9,105,789 B2 * | 8/2015 | Mazzillo | ............... H01L 31/107 |
| 2010/0025756 A1 | 2/2010 | Fu et al. | |
| 2013/0256795 A1 * | 10/2013 | Tsuchiko | ............ H01L 29/7835 |
| | | | 257/343 |

(Continued)

FOREIGN PATENT DOCUMENTS

| | | |
|---|---|---|
| TW | 200816201 A | 4/2008 |
| TW | 201214441 A1 | 4/2012 |

*Primary Examiner* — Kevin M Picardat
(74) *Attorney, Agent, or Firm* — Birch, Stewart, Kolasch & Birch, LLP

(57) ABSTRACT

An ultra-high voltage device is provided. The ultra-high voltage device includes a substrate, a first well zone formed in the substrate, a second well zone having a surface formed in the substrate adjacent to the first well zone, a gate oxide formed on the first well zone and the second well zone of the substrate, a gate formed on the gate oxide, a channel formed in the first well zone underneath the gate oxide, an accumulation region formed in the second well zone underneath the gate oxide adjacent to the channel, wherein only a part of the accumulation region is implanted with a dopant to form an implant region therein, and an insulation region formed on the surface of the second well zone of the substrate adjacent to the accumulation region, wherein a boundary is formed between the insulation region and the accumulation region.

10 Claims, 4 Drawing Sheets

(56) References Cited

U.S. PATENT DOCUMENTS

| | | | |
|---|---|---|---|
| 2016/0035822 A1* | 2/2016 | Renaud | H01L 29/4175 257/339 |
| 2016/0035883 A1* | 2/2016 | Hao | H01L 29/7816 257/339 |
| 2016/0099346 A1 | 4/2016 | Yang et al. | |

* cited by examiner

ULTRA-HIGH VOLTAGE DEVICES

BACKGROUND OF THE INVENTION

Field of the Invention

The invention relates to an ultra-high voltage device, and more particularly to an ultra-high voltage device which is capable of effectively reducing the hot carrier injection (HCI) effect.

Description of the Related Art

In general, an ultra-high voltage device adopts a gate oxide permitting 20 volts (470 Å) to 40 volts (1,100 Å) arranged with a high voltage device of 20 volts to 40 volts to drive itself. In most DC/AC circuits, actual gate voltage is within about 10 volts to 30 volts. However, in relevant lighting applications of light-emitting diodes (LEDs), for cost considerations, the high voltage device is omitted. Only a device of 5 volts is utilized to drive the ultra-high voltage device. In this manner, an ultra-high voltage device with gate oxide permitting 5 volts (115 Å) is required. However, installation of such gate oxide makes strength of electric field underneath a bird's beak in a drift zone substantially increase due to such thin gate oxide, resulting in a decrease in the reliability of the device. For example, when an electrical measurement of the device is performed, carriers are injected into the gate oxide due to formation of a strong electric field underneath the bird's beak, resulting in deterioration of the characteristics of the device, and generating the so-called hot carrier injection (HCI) effect.

Currently, device failure caused by hot carrier invasion can be improved by implanting dopants in an accumulation region. However, the on-resistance (Rds-on) of the devices will increase substantially due to the blanket implantation of the dopants in the accumulation region.

BRIEF SUMMARY OF THE INVENTION

One embodiment of the invention provides an ultra-high voltage device comprising a substrate; a first well zone formed in the substrate; a second well zone having a surface formed in the substrate adjacent to the first well zone; a gate oxide formed on the first well zone and the second well zone of the substrate; a gate formed on the gate oxide; a channel formed in the first well zone underneath the gate oxide; an accumulation region formed in the second well zone underneath the gate oxide adjacent to the channel, wherein only a part of the accumulation region is implanted with a dopant to form an implant region therein; and an insulation region formed on the surface of the second well zone of the substrate adjacent to the accumulation region, wherein a boundary is formed between the insulation region and the accumulation region.

In one embodiment, the substrate is a P-type substrate.

In this embodiment, the first well zone is a P-type well zone, the second well zone is an N-type well zone, and the dopant is a P-type dopant.

In one embodiment, the gate oxide has thickness ranging from about 100 Å to about 400 Å.

In one embodiment, the implant region occupies 10-90% or 20-50% of the accumulation region.

In one embodiment, the implant region is extended along the accumulation region from the boundary between the accumulation region and the insulation region.

In one embodiment, the implant region is a continuous implant region.

In one embodiment, the implant region comprises a plurality of sub-implant regions separated from each other.

In one embodiment, the insulation region comprises a field oxide or a shallow trench isolation (STI).

The invention adopts a dopant with an opposite conductivity to the second well zone (a draft zone). For example, a P-type dopant is selected and implanted while the second well zone is an N-type well zone. The dopant is implanted in a part of the accumulation region underneath the gate oxide, for example, the implant region occupying 10-90% of the accumulation region. The doping range of the dopant is extended along the accumulation region from the boundary between the accumulation region and the insulation region. The strength of the electric field of the second well zone is thus reduced, effectively avoiding a hot carrier injection (HCI) effect influencing reliability of devices and resulting in damage to the devices, which is generated by high-concentration hot carrier at the boundary between the accumulation region and the insulation region. A substantially increased on-resistance (Rds-on) caused by performing a conventional blanket implantation for reducing the concentration of the accumulation region is simultaneously improved due to implantation of the dopant only in a part of the accumulation region of the present invention.

Additionally, in the invention, the implant type in the accumulation region is not limited. Only an implant type that is distinct from conventional blanket implantation is required. The proper implant types utilized in the invention comprise a continuous implant type or formation of a plurality of sub-implant regions separated from each other. Furthermore, the implant technology of the invention is widely applied on various semiconductor structures with field oxide or shallow trench isolation (STI).

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
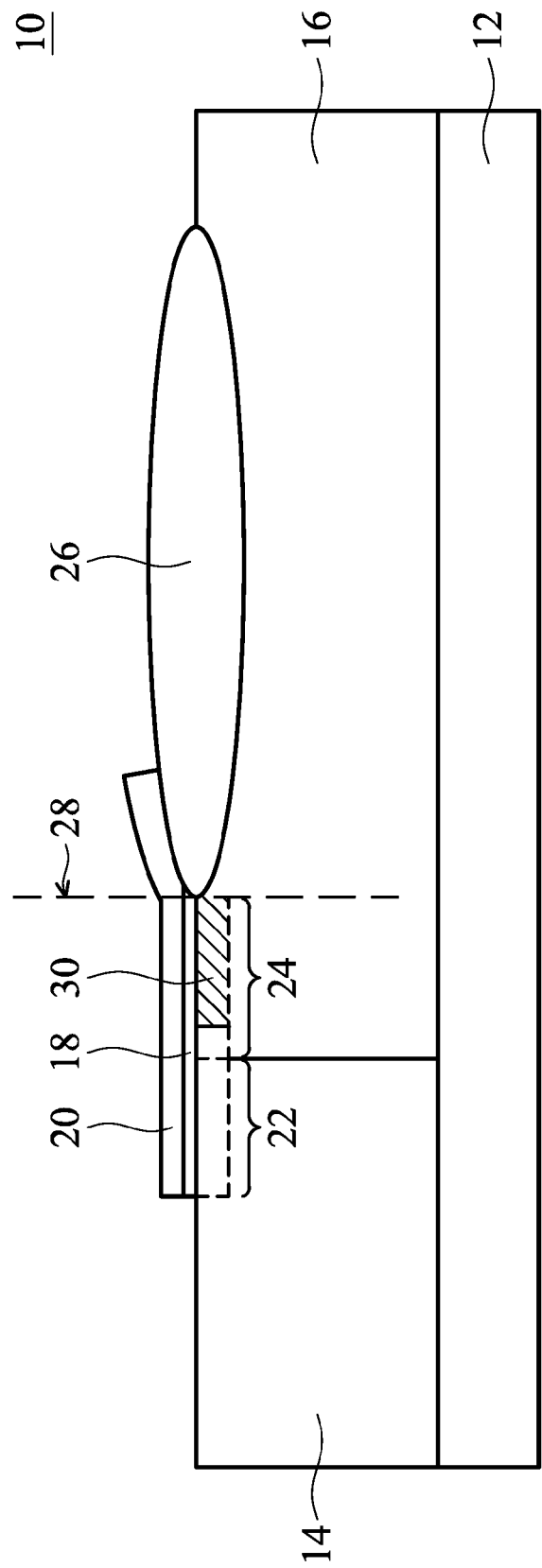
FIG. 1 is a cross-sectional view of an ultra-high voltage device in accordance with one embodiment of the invention.

Referring to FIG. 1, in accordance with one embodiment of the invention, an ultra-high voltage device 10 is provided. FIG. 1 is a cross-sectional view of the ultra-high voltage device 10.

As shown in FIG. 1, in this embodiment, the ultra-high voltage device 10 comprises a substrate 12, a first well zone 14, a second well zone 16, a gate oxide 18, a gate 20, a channel 22, an accumulation region 24, and an insulation region 26.

The first well zone 14 is formed in the substrate 12. The second well zone 16 is formed in the substrate 12 adjacent to the first well zone 14. The gate oxide 18 is formed on the first well zone 14 and the second well zone 16 of the substrate 12. The gate 20 is formed on the gate oxide 18. The channel 22 is formed in the first well zone 14 underneath the gate oxide 18. The accumulation region 24 is formed in the second well zone 16 underneath the gate oxide 18 adjacent to the channel 22. The insulation region 26 is formed on the surface of the second well zone 16 of the substrate 12 adjacent to the accumulation region 24. A boundary 28 is formed between the insulation region 26 and the accumulation region 24. Specifically, only a part of the accumulation region 24 is implanted with a dopant to form an implant region 30 therein.

In some embodiments, the substrate 12 may be a P-type substrate.

When the substrate 12 is a P-type substrate, the first well zone 14 is a P-type well zone, the second well zone 16 is an N-type well zone, and the dopant is a P-type dopant. That is, the implant region 30 is a P-type implant region.

In some embodiments, the substrate 12 may be an N-type substrate.

When the substrate 12 is an N-type substrate, the first well zone 14 is an N-type well zone, the second well zone 16 is a P-type well zone, and the dopant is an N-type dopant. That is, the implant region 30 is an N-type implant region.

In some embodiments, the gate oxide 18 has thickness ranging from about 100 Å to about 400 Å.

In some embodiments, the implant region 30 occupies about 10-90% or about 20-50% of the accumulation region 24.

In some embodiments, the implant region 30 is extended along the accumulation region 24 from the boundary 28 between the accumulation region 24 and the insulation region 26.

In some embodiments, the implant region 30 may be a continuous implant region, as shown in FIG. 1.

In some embodiments, the insulation region 26 may comprise a field oxide, as shown in FIG. 1.

Figure 2:
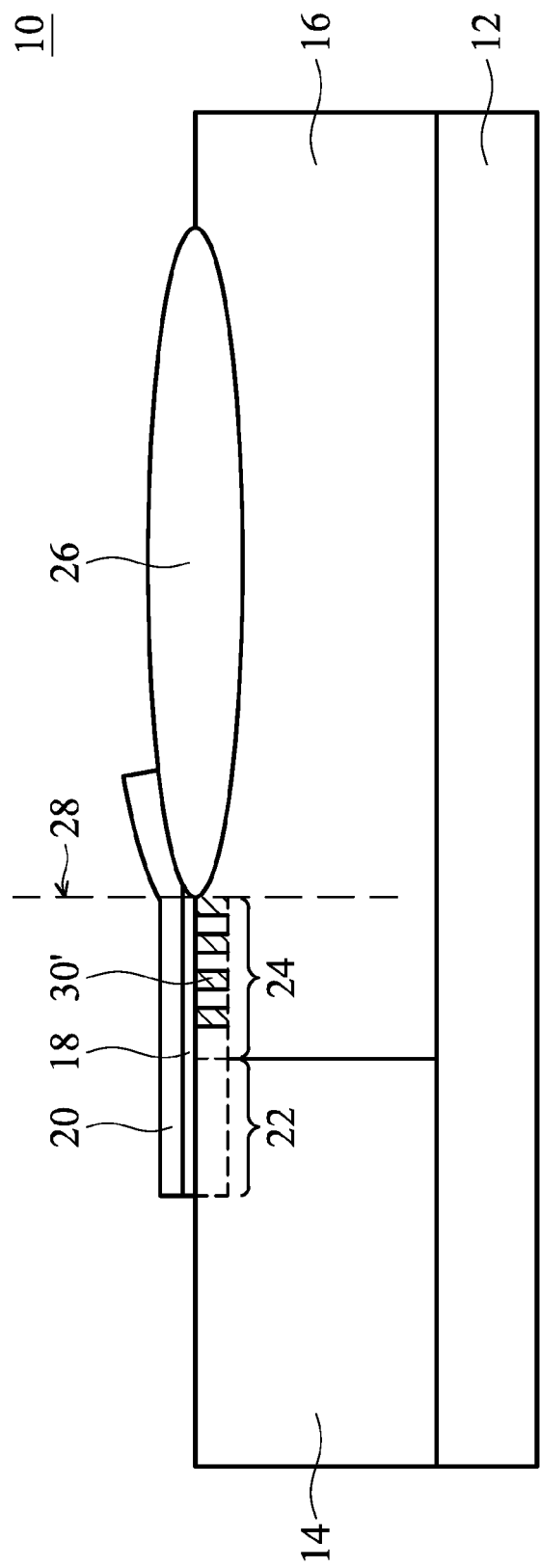
FIG. 2 is a cross-sectional view of an ultra-high voltage device in accordance with one embodiment of the invention.

Referring to FIG. 2, in accordance with one embodiment of the invention, an ultra-high voltage device 10 is provided. FIG. 2 is a cross-sectional view of the ultra-high voltage device 10.

As shown in FIG. 2, in this embodiment, the ultra-high voltage device 10 comprises a substrate 12, a first well zone 14, a second well zone 16, a gate oxide 18, a gate 20, a channel 22, an accumulation region 24, and an insulation region 26.

The first well zone 14 is formed in the substrate 12. The second well zone 16 is formed in the substrate 12 adjacent to the first well zone 14. The gate oxide 18 is formed on the first well zone 14 and the second well zone 16 of the substrate 12. The gate 20 is formed on the gate oxide 18. The channel 22 is formed in the first well zone 14 underneath the gate oxide 18. The accumulation region 24 is formed in the second well zone 16 underneath the gate oxide 18 adjacent to the channel 22. The insulation region 26 is formed on the surface of the second well zone 16 of the substrate 12 adjacent to the accumulation region 24. A boundary 28 is formed between the insulation region 26 and the accumulation region 24. Specifically, only a part of the accumulation region 24 is implanted with a dopant to form an implant region 30 therein.

In some embodiments, the substrate 12 may be a P-type substrate.

When the substrate 12 is a P-type substrate, the first well zone 14 is a P-type well zone, the second well zone 16 is an N-type well zone, and the dopant is a P-type dopant. That is, the implant region 30 is a P-type implant region.

In some embodiments, the substrate 12 may be an N-type substrate.

When the substrate 12 is an N-type substrate, the first well zone 14 is an N-type well zone, the second well zone 16 is a P-type well zone, and the dopant is an N-type dopant. That is, the implant region 30 is an N-type implant region.

In some embodiments, the gate oxide 18 has thickness ranging from about 100 Å to about 400 Å.

In some embodiments, the implant region 30 occupies about 10-90% or about 20-50% of the accumulation region 24.

In some embodiments, the implant region 30 is extended along the accumulation region 24 from the boundary 28 between the accumulation region 24 and the insulation region 26.

In some embodiments, the implant region 30 may comprise a plurality of sub-implant regions 30' separated from each other, as shown in FIG. 2.

In some embodiments, the insulation region 26 may comprise a field oxide, as shown in FIG. 2.

Figure 3:
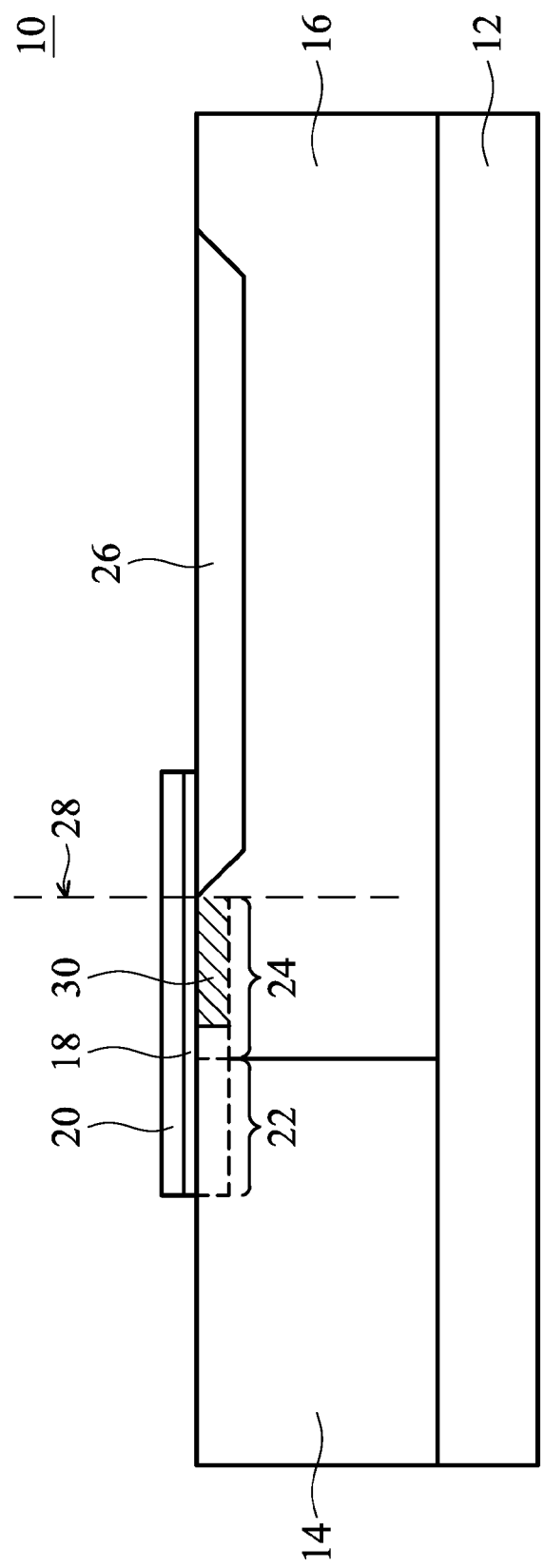
FIG. 3 is a cross-sectional view of an ultra-high voltage device in accordance with one embodiment of the invention.

Referring to FIG. 3, in accordance with one embodiment of the invention, an ultra-high voltage device 10 is provided. FIG. 3 is a cross-sectional view of the ultra-high voltage device 10.

As shown in FIG. 3, in this embodiment, the ultra-high voltage device 10 comprises a substrate 12, a first well zone 14, a second well zone 16, a gate oxide 18, a gate 20, a channel 22, an accumulation region 24, and an insulation region 26.

The first well zone 14 is formed in the substrate 12. The second well zone 16 is formed in the substrate 12 adjacent to the first well zone 14. The gate oxide 18 is formed on the first well zone 14 and the second well zone 16 of the substrate 12. The gate 20 is formed on the gate oxide 18. The channel 22 is formed in the first well zone 14 underneath the gate oxide 18. The accumulation region 24 is formed in the second well zone 16 underneath the gate oxide 18 adjacent to the channel 22. The insulation region 26 is formed on the surface of the second well zone 16 of the substrate 12 adjacent to the accumulation region 24. A boundary 28 is formed between the insulation region 26 and the accumulation region 24. Specifically, only a part of the accumulation region 24 is implanted with a dopant to form an implant region 30 therein.

In some embodiments, the substrate 12 may be a P-type substrate.

When the substrate 12 is a P-type substrate, the first well zone 14 is a P-type well zone, the second well zone 16 is an N-type well zone, and the dopant is a P-type dopant. That is, the implant region 30 is a P-type implant region.

In some embodiments, the substrate 12 may be an N-type substrate.

When the substrate 12 is an N-type substrate, the first well zone 14 is an N-type well zone, the second well zone 16 is a P-type well zone, and the dopant is an N-type dopant. That is, the implant region 30 is an N-type implant region.

In some embodiments, the gate oxide 18 has thickness ranging from about 100 Å to about 400 Å.

In some embodiments, the implant region 30 occupies about 10-90% or about 20-50% of the accumulation region 24.

In some embodiments, the implant region 30 is extended along the accumulation region 24 from the boundary 28 between the accumulation region 24 and the insulation region 26.

In some embodiments, the implant region 30 may be a continuous implant region, as shown in FIG. 3.

In some embodiments, the insulation region 26 may comprise a shallow trench isolation (STI), as shown in FIG. 3.

Figure 4:
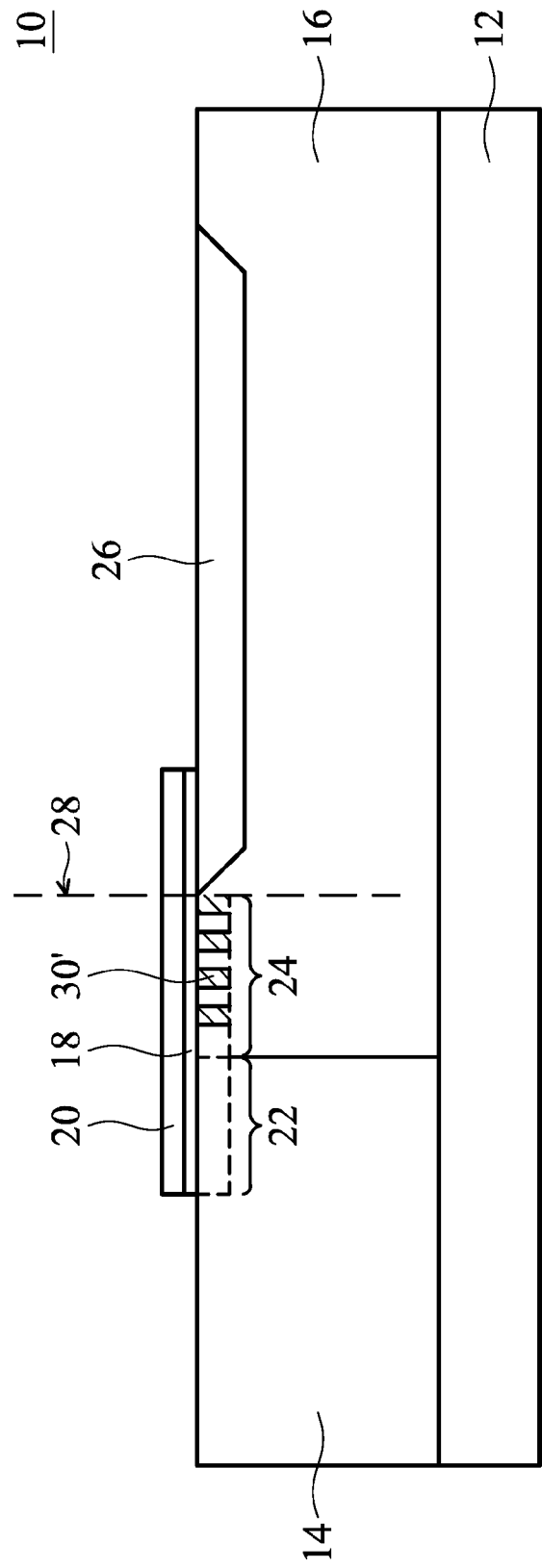
FIG. 4 is a cross-sectional view of an ultra-high voltage device in accordance with one embodiment of the invention.

Referring to FIG. 4, in accordance with one embodiment of the invention, an ultra-high voltage device 10 is provided. FIG. 4 is a cross-sectional view of the ultra-high voltage device 10.

As shown in FIG. 4, in this embodiment, the ultra-high voltage device 10 comprises a substrate 12, a first well zone 14, a second well zone 16, a gate oxide 18, a gate 20, a channel 22, an accumulation region 24, and an insulation region 26.

The first well zone 14 is formed in the substrate 12. The second well zone 16 is formed in the substrate 12 adjacent to the first well zone 14. The gate oxide 18 is formed on the first well zone 14 and the second well zone 16 of the substrate 12. The gate 20 is formed on the gate oxide 18. The channel 22 is formed in the first well zone 14 underneath the gate oxide 18. The accumulation region 24 is formed in the second well zone 16 underneath the gate oxide 18 adjacent to the channel 22. The insulation region 26 is formed on the surface of the second well zone 16 of the substrate 12 adjacent to the accumulation region 24. A boundary 28 is formed between the insulation region 26 and the accumulation region 24. Specifically, only a part of the accumulation region 24 is implanted with a dopant to form an implant region 30 therein.

In some embodiments, the substrate 12 may be a P-type substrate.

When the substrate 12 is a P-type substrate, the first well zone 14 is a P-type well zone, the second well zone 16 is an N-type well zone, and the dopant is a P-type dopant. That is, the implant region 30 is a P-type implant region.

In some embodiments, the substrate 12 may be an N-type substrate.

When the substrate 12 is an N-type substrate, the first well zone 14 is an N-type well zone, the second well zone 16 is a P-type well zone, and the dopant is an N-type dopant. That is, the implant region 30 is an N-type implant region.

In some embodiments, the gate oxide 18 has thickness ranging from about 100 Å to about 400 Å.

In some embodiments, the implant region 30 occupies about 10-90% or about 20-50% of the accumulation region 24.

In some embodiments, the implant region 30 is extended along the accumulation region 24 from the boundary 28 between the accumulation region 24 and the insulation region 26.

In some embodiments, the implant region 30 may comprise a plurality of sub-implant regions 30' separated from each other, as shown in FIG. 4.

In some embodiments, the insulation region 26 may comprise a shallow trench isolation (STI), as shown in FIG. 4.

The invention adopts a dopant with an opposite conductivity to the second well zone (a draft zone). For example, a P-type dopant is selected and implanted while the second well zone is an N-type well zone. The dopant is implanted in a part of the accumulation region underneath the gate oxide, for example, the implant region occupying 10-90% of the accumulation region. The doping range of the dopant is extended along the accumulation region from the boundary between the accumulation region and the insulation region. The strength of the electric field of the second well zone is thus reduced, effectively avoiding the hot carrier injection (HCI) effect influencing the reliability of devices and resulting in damage to the devices, which is generated by a high-concentration hot carrier at the boundary between the accumulation region and the insulation region. A substantially increased on-resistance (Rds-on) caused by performing a conventional blanket implantation for reducing the concentration of the accumulation region is simultaneously improved due to implantation of the dopant only in a part of the accumulation region of the present invention.

Additionally, in the invention, the implant type in the accumulation region is not limited. Only an implant type that is distinct from conventional blanket implantation is required. The proper implant types utilized in the invention comprise a continuous implant type or formation of a plurality of sub-implant regions separated from each other. Furthermore, the implant technology of the invention is widely applied on various semiconductor structures with field oxide or shallow trench isolation (STI).

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An ultra-high voltage device, comprising:
a substrate;
a first well zone formed in the substrate;
a second well zone having a surface formed in the substrate adjacent to the first well zone;
a gate oxide formed on the first well zone and the second well zone of the substrate;
a gate formed on the gate oxide;
a channel formed in the first well zone underneath the gate oxide;
an accumulation region formed in the second well zone underneath the gate oxide adjacent to the channel, wherein only a part of the accumulation region is implanted with a dopant to form an implant region therein, and the implant region comprises a plurality of sub-implant regions separated from each other; and
an insulation region formed on the surface of the second well zone of the substrate adjacent to the accumulation region, wherein a boundary is formed between the insulation region and the accumulation region.

2. The ultra-high voltage device as claimed in claim 1, wherein the substrate is a P-type substrate.

3. The ultra-high voltage device as claimed in claim 2, wherein the first well zone is a P-type well zone.

4. The ultra-high voltage device as claimed in claim 2, wherein the second well zone is an N-type well zone.

5. The ultra-high voltage device as claimed in claim 1, wherein the gate oxide has thickness ranging from 100 Å to 400 Å.

6. The ultra-high voltage device as claimed in claim 4, wherein the dopant is a P-type dopant.

7. The ultra-high voltage device as claimed in claim 1, wherein the implant region occupies 10-90% of the accumulation region.

8. The ultra-high voltage device as claimed in claim 1, wherein the implant region occupies 20-50% of the accumulation region.

9. The ultra-high voltage device as claimed in claim 1, wherein the implant region is extended along the accumulation region from the boundary between the accumulation region and the insulation region.

10. The ultra-high voltage device as claimed in claim 1, wherein the insulation region comprises a field oxide or a shallow trench isolation (STI).

* * * * *